(12) United States Patent
Hébert et al.

(10) Patent No.: US 8,110,472 B2
(45) Date of Patent: Feb. 7, 2012

(54) HIGH POWER AND HIGH TEMPERATURE SEMICONDUCTOR POWER DEVICES PROTECTED BY NON-UNIFORM BALLASTED SOURCES

(75) Inventors: François Hébert, San Mateo, CA (US); Anup Bhalla, Santa Clara, CA (US)

(73) Assignee: Alpha and Omega Semiconductor Ltd (BM)

( * ) Notice: Subject to any disclaimer, the term of this patent is extended or adjusted under 35 U.S.C. 154(b) by 0 days.

(21) Appl. No.: 13/199,251

(22) Filed: Aug. 23, 2011

(65) Prior Publication Data

US 2011/0306175 A1    Dec. 15, 2011

Related U.S. Application Data

(62) Division of application No. 12/074,087, filed on Feb. 28, 2008, now Pat. No. 8,008,747.

(51) Int. Cl.
*H01L 21/331* (2006.01)
*H01L 21/8222* (2006.01)

(52) U.S. Cl. ........ 438/317; 438/309; 438/311; 438/312; 438/330; 438/333; 257/582; 257/197; 257/565; 257/341

(58) Field of Classification Search .................. 438/317, 438/309, 311, 312, 330, 333, 343, 199, 128, 438/200, 224, 226; 257/565, 567–573, 578–582, 257/197–200, 341, 133, 146
See application file for complete search history.

(56) References Cited

U.S. PATENT DOCUMENTS

| | | | |
|---|---|---|---|
| 4,500,900 A | 2/1985 | Shimizu | |
| 5,338,693 A | 8/1994 | Kinzer et al. | |
| 5,475,252 A | 12/1995 | Merrill et al. | |
| 5,763,919 A | 6/1998 | Lin | |
| 5,821,602 A | 10/1998 | Hebert | |
| 5,869,381 A | 2/1999 | Hebert | |
| 6,268,286 B1 | 7/2001 | Gauthier et al. | |
| 6,331,726 B1 | 12/2001 | Voldman | |
| 6,365,932 B1 * | 4/2002 | Kouno et al. | 257/341 |
| 6,441,410 B2 | 8/2002 | Gauthier et al. | |
| 6,559,507 B1 | 5/2003 | Vashchenko et al. | |
| 6,583,972 B2 | 6/2003 | Verhaege et al. | |
| 6,587,320 B1 | 7/2003 | Russ et al. | |
| 6,707,341 B2 * | 3/2004 | Yamamoto et al. | 330/289 |
| 6,927,458 B2 | 8/2005 | Worley | |
| 6,946,720 B2 * | 9/2005 | Beasom | 257/582 |
| 7,212,072 B1 * | 5/2007 | Esfandiari et al. | 330/295 |
| 2008/0012645 A1 * | 1/2008 | Ichitsubo et al. | 330/307 |

* cited by examiner

*Primary Examiner* — Zandra Smith
*Assistant Examiner* — Telly Green
(74) *Attorney, Agent, or Firm* — Bo-In Lin (57) ABSTRACT

A semiconductor power device is formed on a semiconductor substrate. The semiconductor power device includes a plurality of transistor cells distributed over different areas having varying amount of ballasting resistances depending on a local thermal dissipation in each of the different areas. An exemplary embodiment has the transistor cells with a lower ballasting resistance formed near a peripheral area and the transistor cells having a higher ballasting resistance are formed near a bond pad area. Another exemplary embodiment comprises cells with a highest ballasting resistance formed in an area around a wire-bonding pad, the transistor cells having a lower resistance are formed underneath the wire-bonding pad connected to bonding wires for dissipating heat and the transistor cells having a lowest ballasting resistance are formed in an areas away from the bonding pad.

19 Claims, 7 Drawing Sheets

HIGH POWER AND HIGH TEMPERATURE SEMICONDUCTOR POWER DEVICES PROTECTED BY NON-UNIFORM BALLASTED SOURCES

This patent application is a Divisional Application and claims the Priority Date of a application Ser. No. 12/074,087 filed on Feb. 28, 2008 now U.S. Pat. No. 8,008,747 by common Inventors of this Application. The Disclosures made in the patent application Ser. No. 12/074,087 are hereby incorporated by reference.

BACKGROUND OF THE INVENTION

1. Field of the Invention

The invention relates generally to the vertical semiconductor power devices. More particularly, this invention relates to configurations and methods of manufacturing of vertical semiconductor power devices with transistor cells with non-uniform ballasted sources to protect the semiconductor power devices to reliably operate at high power and high temperature conditions.

2. Description of the Prior Art

Conventional technologies of manufacturing and configuring semiconductor power devices are still confronted with a technical difficulty that devices provided for reliably operating at high power and high temperature usually have high Rdson resistance. Specifically, high reliability is expected from power transistors designed for operating at high power, i.e., high voltage and current, and high temperature applications. One exemplary application is the power transistors implemented in the DC brushless motor control. On the one hand the reliability of the power transistors, such as a MOSFET device, is improved because of the positive temperature coefficient of the Rdson resistance. But in the meantime, the threshold voltage of a MOSFET device has a negative temperature coefficient at relatively low currents and in the linear mode of operation. The leads to a condition that the net voltage (Vgs−Vt), i.e., the gate to drain voltage Vgs minus the threshold voltage Vt, can increase with increasing temperature. A temperature runaway condition may occur to cause a device failure. The temperature runaway problem may occur to both the trench-gate DMOS devices as well as planar power MOSFET devices due to the underlined phenomenon of the negative temperature coefficient of the threshold voltage.

Figure 1:
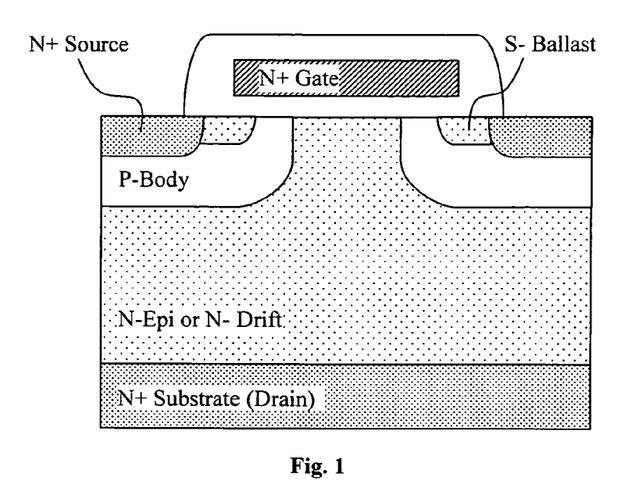
FIG. 1 is a cross sectional view for showing a source ballasting structure of a MOSFET device.

In order to overcome such difficulties, a technique of source ballasting is implemented to improve the thermal stability of the MOSFET devices. The source ballasting technique is similar to the emitter ballasting applied in the bipolar technology. FIG. 1 depicts a MOSFET device implementing a source-ballasting configuration. The MOSFET device includes a source region encompassed inside a body region wherein a portion of the source region shown as S-ballast is doped with a lower concentration of source dopant. The S-ballast region constitutes a ballast resistor Rs for providing a feedback to counter the increase of the voltage due to the negative temperature coefficient of the threshold voltage. The source to drain current, i.e., Ids, increases due to the increase of the voltage when the threshold voltage is reduced with increased temperature. The Rdson thus increases to limit further increase of the current for preventing a thermal runaway problem. Significant increase of Rdson resistance often adversely affects the device performance due to a conventional configuration of uniformly implementing the source ballasting over the entire areas of the semiconductor power devices.

Specifically, the source ballasting techniques have been disclosed in U.S. Pat. Nos. 5,475,252, 5,763,9191, 6,268,286, 6,331,726, 6,441,410, 6,583,972, 6,587,320, and 6,927,458. The semiconductor power devices such as MOSFET devices disclosed in these patented inventions implement a technique of uniform ballasting to increase the thermal stability. However, the Rdson is greatly increased and the device performance is adversely affected due the uniform addition of the source resistance by implementing the conventional ballasting technologies.

Therefore, a need still exists in the art of power semiconductor device design and manufacture to provide new device configurations and methods of manufacturing the power devices such that the above discussed problems and limitations can be resolved.

SUMMARY OF THE PRESENT INVENTION

It is therefore an aspect of the present invention to provide a new and improved device configuration and method of manufacturing the semiconductor power device with source ballasting to provide internal and local feedback for minimizing the localized thermal runaway instead of using a uniform ballasting configuration such that the significant Rdson increase may be reduced and the above-discussed difficulties can be resolved.

Specifically, it is an aspect of the present invention to provide a new and improved device configuration and method of manufacturing the semiconductor power device by varying the amount of ballasting over the device areas by taking advantage of the thermal dissipation and profile of the structure to overall increase of the Rdson. Specifically, the semiconductor power device has a lower temperature near the edges and higher temperature near the center of die and near the bond pads when the larger amount of current passing through. Corresponding to these temperature distributions and electric operation characteristics in different areas of the device, the source ballasting is selective distributed with variation to effectively prevent the thermal runaway problems while minimizing the increase of the resistance.

Briefly in a preferred embodiment this invention discloses a semiconductor power device disposed on a semiconductor substrate. The semiconductor power device includes a plurality of transistor cells distributed over different areas having varying amount of ballasting resistances depending on a local thermal dissipation in each of the different areas. In an exemplary embodiment, the transistor cells having a lower ballasting resistance are disposed near a peripheral area and the transistor cells having a higher ballasting resistance are disposed near a bond pad area. In another exemplary embodiment, the transistor cells having a highest ballasting resistance are disposed in an area around a wire-bonding pad, the transistor cells having a lower resistance are disposed underneath the wire-bonding pad connected to bonding wires for dissipating therefrom and the transistor cells having a lowest ballasting resistance are disposed in an areas away from the bonding pad.

Furthermore, this invention discloses a method of manufacturing a semiconductor power device on a semiconductor substrate by forming a plurality of transistor cells on the semiconductor substrate. The method further includes a step of manufacturing the transistor cells with different ballasting resistance for transistor cells distributed over different areas depending on a local thermal dissipation from each of the different areas. In an exemplary embodiment, the method includes a step to manufacture the transistor cells with a lower resistance in a peripheral area of the semiconductor substrate and higher ballasting resistances near a bond pad of the semiconductor substrate. In another exemplary embodiment, the step of manufacturing the transistor cells with varying ballasting resistances further includes a step of manufacturing the transistor cells with a highest ballasting resistance in an area around a wire-bonding area and a lower ballasting resistance under a bonding pad with bonding wires conducting heat therefrom and a lowest ballasting resistance in a peripheral area away from the bonding pad.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 2A:
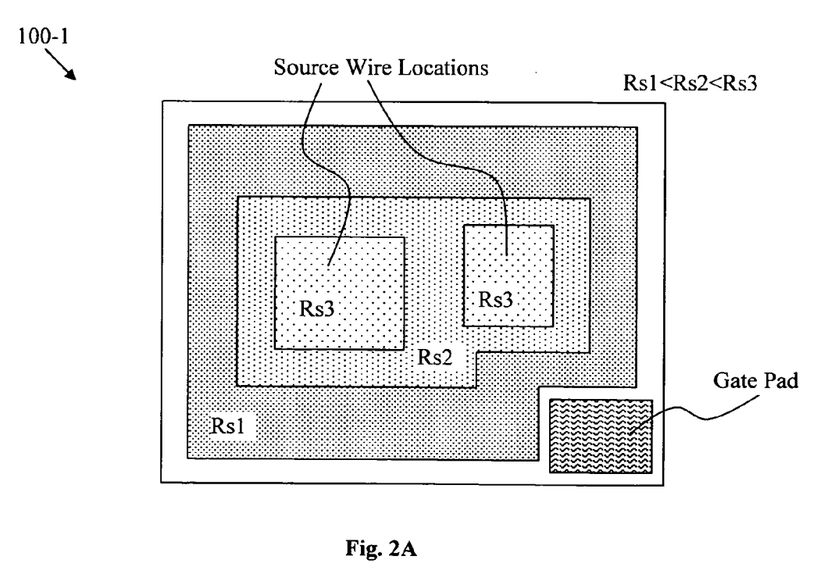
FIGS. 2A, 2B, 3A, 3B, 4, 5A and 5B are top views of the semiconductor power device of this invention with non-uniform ballasting configuration depending on the location of different regions in the device.
Figure 2B:
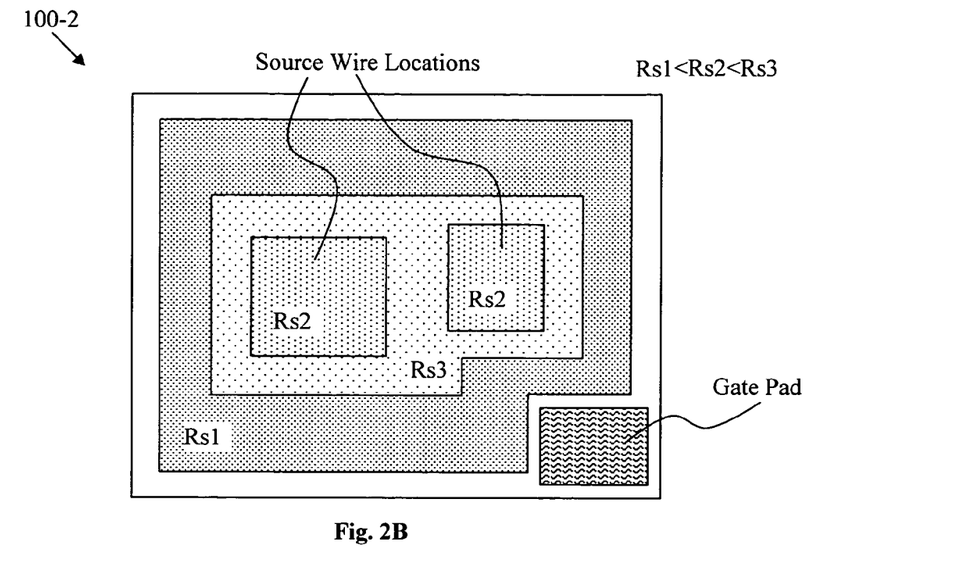

Referring to FIGS. 2A and 2B for two alternate top views of a semiconductor power device 100-1 and 100-2 respectively implemented with source ballasting configuration of this invention. In FIG. 2A, the entire surface of the device is divided into several areas include a gate bond pad area near the lower-left corner of the surface. The device further includes three different ballasting areas, i.e., Rs1, Rs2, and Rs3. The Rs3 area is an area designated as location for source wire bonding with area Rs2 surrounding the area Rs3 and a peripheral area Rs1 near the edges of the device surface. According to the actual inspection of device failures caused by thermal runaway problems, the damaged silicon usually occurs in five to fifteen seconds with a current of one to twenty amperes at a temperature of 180 to 200 degrees Celsius. The damages are observed mostly near or between the bond wires while the regions outside the wire bonding areas and under the bond wires rarely have any problems of overheating damages. For this reason, the ballasting resistors implemented with reduced source doping are varyingly distributed by making the resistances in these different areas having different ballasting effects. Specifically, in FIGS. 2A and 2B, a non-uniform ballasting source doping is implemented with Rs3>Rs2>Rs1. The highest ballasting effect is localized for an area with highest current and highest probability of thermal damages. In FIG. 2A, the surrounding areas Rs2 and the peripheral area Rs1 are implemented with reduced ballasting dopant profile thus the increase of the Rdson resistance can be reduced while the most vulnerable regions near the source wires, e.g., area Rs3, are protected. In FIG. 2B, the thermal dissipation effect of bonding wires is considered and the area directly under bond wires is expected to be cooler than the direct surrounding area therefore the bond wire area has a lower ballasting than its direct surrounding area.

Figure 3A:
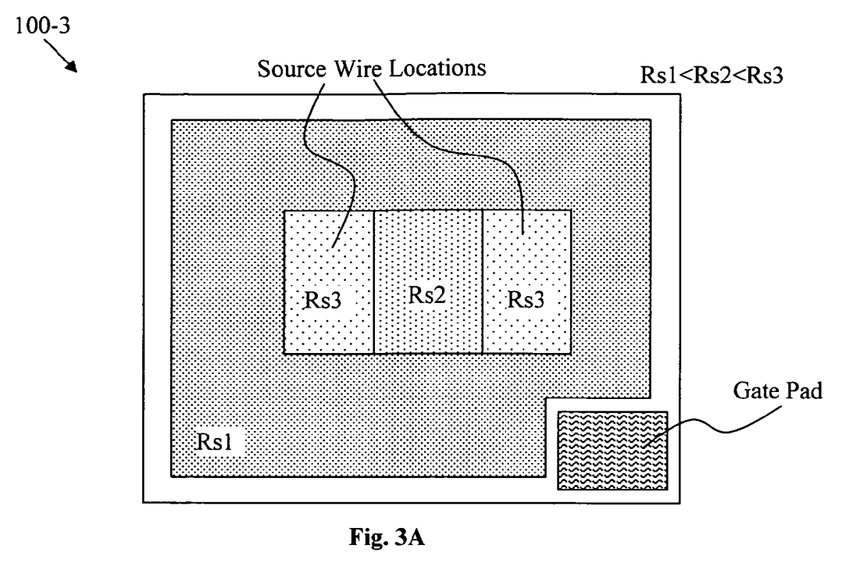
Figure 3B:
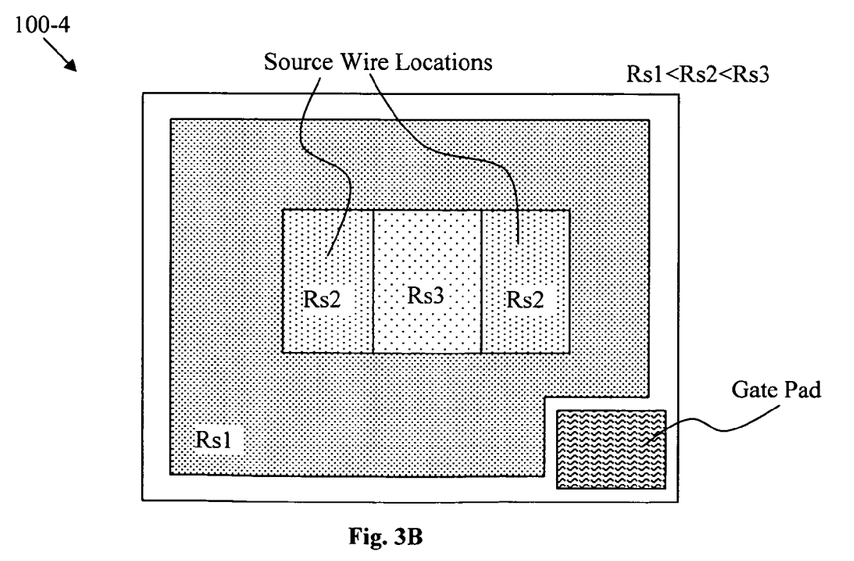
Figure 4:
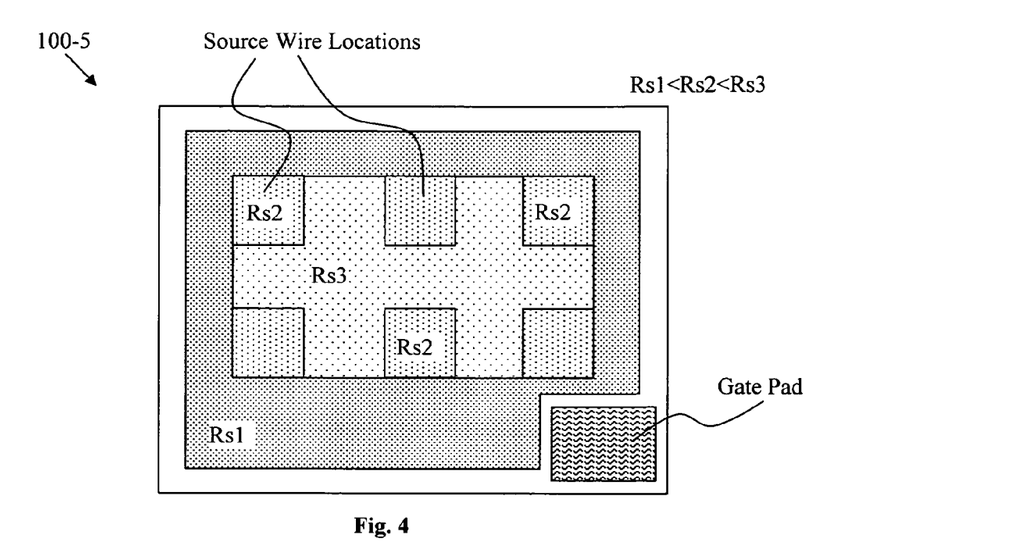
Figure 5A:
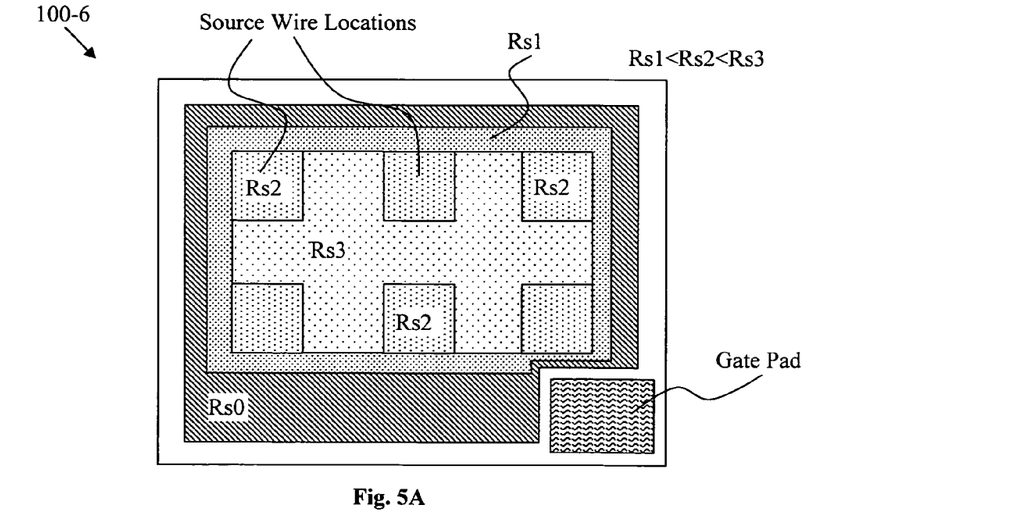
Figure 5B:
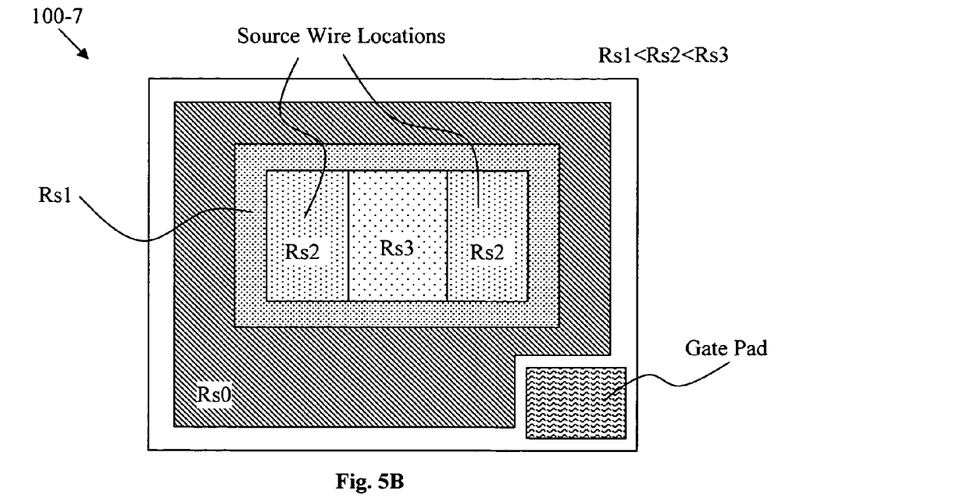

FIGS. 3A and 3B are two alternate top views for showing another exemplary embodiment of this invention. FIGS. 3A and 3B show the semiconductor power device 100-3 and 110-4 have designated source wire locations depicted as area Rs3 with adjacent areas depicted as Rs2 and surrounding peripheral areas depicted as Rs1. Again, the ballasting resistors are implemented in the transistor cells in these areas such that varyingly distribution of ballasting resistances is structured with Rs3>Rs2>Rs1. FIG. 3A shows the wire bonding area has the highest ballasting. In case the bond wires provide good thermal dissipation effect, the ballasting in bond wire region can be reduced as shown in FIG. 3B. FIG. 4 is a top view of another exemplary semiconductor power device 100-5 that has multiple areas as bond wire locations depicted as area Rs2 with surrounding areas depicted as Rs3 and the peripheral areas depicted as Rs1. A non-uniform source ballasting doping profile is implemented to produce a device with varyingly distribution of ballasting resistances in these different areas with Rs3>Rs2>Rs1. Again the thermal cooling effect of bond wires enable the reduction of ballasting in bond wire areas. FIGS. 5A and 5B show two top views corresponding to the devices illustrated in FIGS. 4 and 3B respectively. The only difference is that the devices 100-6 and 100-7 shown in FIGS. 5A and 5B have non-uniform ballasting profiles with Rs3>Rs2>Rs1 and Rs0=0. The ballasting is limited to a center area and the source dopant concentrations for the transistor cells in the area Rs0 is kept the same as a transistor cell without source ballasting reduction such that the increase of Rdson resistance can be further reduced.

The exemplary embodiments shown in FIGS. 2A to 5B are only examples for illustrating some of possible applications. The variable ballasting doping profiles can be implemented in many different ways including but not limited to gradually increasing the ballasting from the edge of the die to the bond pad regions. A highest ballasting may be formed directly around the bond pads. The heat generated in the areas directly under the bond pads is expected to conduct through the bond wires; therefore, the areas directly under the bond pads may be implemented with reduced ballasting. In a power device that has multiple wire bonding areas, a highest ballasting may be implemented under and around the bonding areas with lowest ballasting on the peripheral and outside edges of the device and medium ballasting between the bond pads. Another configuration may be implemented with a source doping profile to generate highest ballasting resistance between the bond pads taking advantage of the fact that the part of the heat direct under the bond pads is removed by conduction through the bonding wires. This is confirmed by the observation that actual damages are found mostly between the bond pads and not directly under the bond pads. The combination of these implementation options may be further combined with a doping profile that the transistor cells on the peripheral edges are manufactured without source doping reduction thus providing zero ballasting on the peripheral and areas away from the bonding pads thus further reducing the resistance increase due to the implementation of the ballasting doping configurations.

The variable and non-uniform ballasting configuration for protecting the semiconductor power devices as discussed above may be applied to vertical DMOS devices including but not limited to devices with planar gate, trench gate, shielded gate and various trench gate structures. The ballasting source dopant variation processes as discussed above may further be implemented for high power lateral DMOS structure even though the power density for this type of devices is generally lower due to larger cell pitch of the LDMOS structures compared to the vertical DMOS structures. This technique may also be applied to other types of power semiconductor devices such as Insulated Gate Bipolar Transistors (IGBT).

Figure 6:
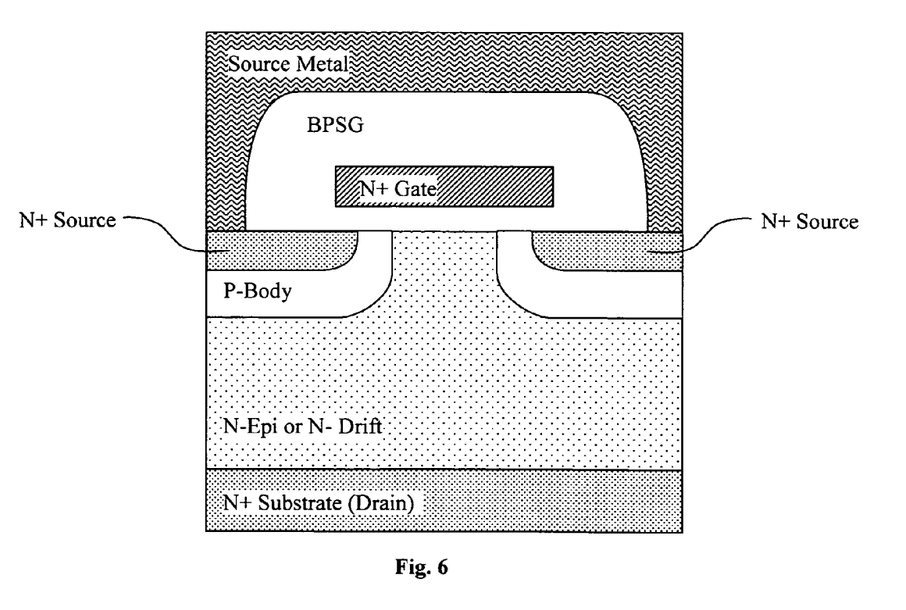
FIG. 6 is a cross sectional view for showing a MOSFET with remote metal to the N+ source contacts with smaller source contacts for increasing the space of the source contacts over the source diffusion regions to increase of source ballasting effects.

The non-uniform ballasting configuration for the semiconductor power devices may be implemented with various methods. A remote metal to the N+ silicon contact may be utilized that has smaller source contacts thus increasing the space of the source contacts over the source diffusion regions and resulting in increase of source ballasting effects as shown in FIG. 6.

Another configuration of the device to implement the ballasting protection is to provide higher resistance diffusion between the source contact and the source edge of the gate regions. This is realized by applying a lightly doped drain (LDD) type of concept by using a mask or spacer to separate the highly doped N++ source diffusion regions from the lower doped N− regions that reaches the gate for a NMOS device.

Figure 7A:
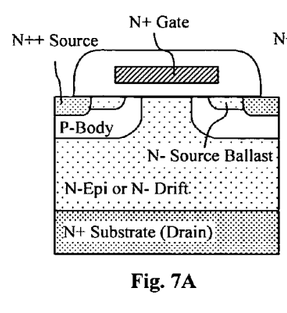
FIGS. 7A, 7B and 7C are cross sectional views showing possible implementations of source ballasting areas Rs1, Rs2, and Rs3.
Figures 7B, 7C:
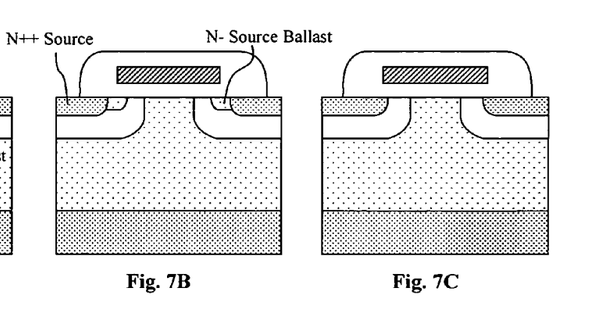

FIGS. 7A-7C show a possible implementation of the variable source ballasting by separating the highly doped N++ source diffusion regions from the gate region with lower doped N− Source Ballast regions. FIG. 6A, FIG. 6B and FIG. 6C show the source ballasting areas Rs3, Rs2, and Rs1, respectively. In FIG. 6A, the N− Source Ballast region is relatively large, so the ballast resistance for Rs3 is fairly large. In FIG. 6B, the N− Source Ballast region is relatively small, so the ballast resistance of Rs2 is less than that of Rs3. In FIG. 6C, there is no N− Source Ballast region at all, so the resistance of Rs1 is even less than that of Rs2.

The N− Source Ballast regions can be formed by first performing a light N− implant, using the gate for self-alignment. Later a mask or spacer oxide around the gate region can allow a highly doped N++ source implant to be performed while preserving the lightly doped N− Source Ballast regions near the gate region.

Figure 8A:
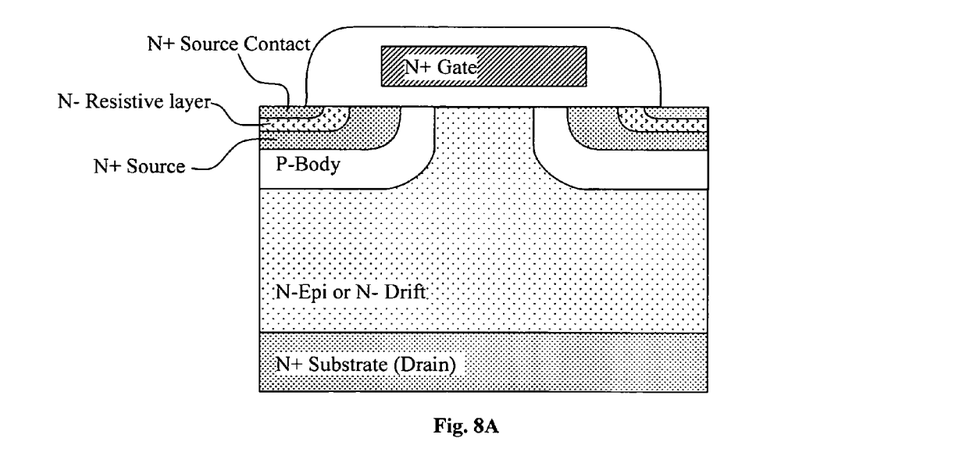
FIGS. 8A and 8B are cross sectional views for showing a MOSFET with a resistive layer between the source and the N+ silicon to increase the source ballasting effects.
Figure 8B:
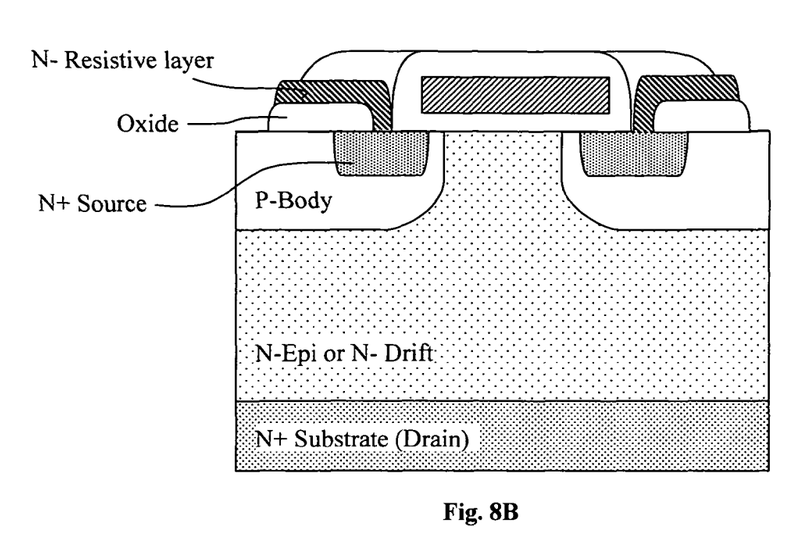

Alternately, the source-ballasting configuration may be implemented by the use of a resistive layer to contact the source by adding a resistive layer between the source contact and the N+ silicon source. FIG. 8A shows one embodiment where the resistive layer is formed by a lightly doped N− diffused layer. FIG. 8B shows another embodiment where the resistive layer is formed by deposition of a Polysilicon or thin-film resistive layer in contact with the source at one end, and sits on an oxide layer at the other end, with a metal contact to it (not shown). The length of resistive layer between the contact metal and the source connection point controls the source ballasting. The characteristics of the resistive layer may also be selectively adjusted in order to control the source ballasting. For manufacturing a device with non-uniform ballasting structure, the resistive layer may be omitted in some regions where no ballasting protection is required. The resistive layer as shown in FIG. 8B can be deposited after the source and contact formation, like thin-film resistors in IC processes. A combination of these different alternative implementations may be applied depending on the specific application of each of these semiconductor power devices.

In summary, this invention discloses a method of manufacturing a semiconductor power device on a semiconductor substrate. The method includes a step of manufacturing a plurality of transistor cells over different areas on the semiconductor substrate having varying amount of ballasting resistances. In an exemplary embodiment, the step of manufacturing the transistor cells having varying amount of ballasting resistances further comprising a step of varying the ballasting resistances depending on a local thermal dissipation in different areas on the semiconductor substrate. Furthermore, this invention also discloses a semiconductor power device disposed on a semiconductor substrate. The semiconductor power device includes a plurality of transistor cells over different areas on the semiconductor substrate having varying amount of ballasting resistances.

The semiconductor power devices with the new and improved ballasting protection can achieve the reduction of the total Rdson because the source ballasting resistors are implemented as function of the thermal dissipation requirements to localized the ballasting functions. Compared to the global uniform distribution of ballasting configurations applied in the conventional technologies, the power device of this invention has significantly reduced Rdson resistance. Furthermore, the localized ballasting protection provides improved reliability when the device is operated under high stress with high current, high current and high temperature with reduce Rdson voltage. Localized and target ballasting protection of the power devices disclosed in this invention therefore achieve improved device performance characteristics, reliably protections, extended operational life, and reduced total operational costs.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method of manufacturing a semiconductor power device on a semiconductor substrate comprising:
   manufacturing a plurality of transistor cells over different areas on said semiconductor substrate having varying amount of ballasting resistances; wherein said step of manufacturing said transistor cells having varying amount of ballasting resistances further comprising a step of varying said ballasting resistance depending on a local thermal dissipation in different areas on said semiconductor substrate; and wherein said step of manufacturing said transistor cells having varying amount of ballasting resistances further comprising a step of manufacturing the transistor cells near an peripheral area to have a lower ballasting resistance and manufacturing the transistor cells near a bond pad area to have a higher ballasting resistance.

2. The method of claim 1 wherein:
   said step of manufacturing said transistor cells having varying amount of ballasting resistances further comprising a step of manufacturing the transistor cells in an area around a wire-bonding pad to have a highest ballasting resistance, manufacturing the transistor cells underneath said wire-bonding pad connected to bonding wires to have a lower ballasting resistance and manufacturing the transistor cells in an areas away from said bonding pad to have a lowest ballasting resistance.

3. The method of claim 1 wherein:
   said step of manufacturing said transistor cells having varying amount of dividing the semiconductor power device into several areas and manufacturing the transistor cells for each of the areas to have a different area-specific ballasting resistance with the transistor cells in the area around a bonding pad to a highest area specific ballasting resistance and the transistor cells in a peripheral area away from the bonding pad to have a lowest area-specific ballasting resistance.

4. The method of claim 2 further comprising a step of:
connecting the bonding pad with bonding wires for conducting heat therefrom; and
manufacturing said transistor cells underneath said bonding pad to have a medium area-specific ballasting resistance between said highest area-specific ballasting resistance and said lowest area-specific ballasting resistance.

5. The method of claim 1 further comprising:
manufacturing the semiconductor power device to have designated source wire areas and areas adjacent to said designated source wire areas; and
manufacturing the transistors cell in said areas adjacent to said designate source wire areas to have a highest area-specific ballasting resistance and manufacturing the transistor cells in said designated source wire areas having a medium area-specific ballasting resistance and manufacturing the transistor cells in areas outside of said designated source wire areas and said areas adjacent to said designated source wire areas having a lowest area-area specific ballasting resistance.

6. The method of claim 1 further comprising:
manufacturing the semiconductor power device to have peripheral areas with the transistor cells manufactured as normal transistor cells without added ballasting effect.

7. The method of claim 1 wherein:
said step of manufacturing said transistor cells having varying amount of ballasting resistances further comprising a step of manufacturing the transistor cells to have gradually increased ballasting resistance from a peripheral area to areas adjacent to source wire locations of said semiconductor power device.

8. The method of claim 1 wherein:
said step of manufacturing said transistor cells having varying amount of ballasting resistances further comprising a step of manufacturing the transistor cells to have a source doping profile to produce a gradually increased ballasting resistance from a peripheral area to areas adjacent to source wire locations of said semiconductor power device.

9. The method of claim 1 wherein:
said step of manufacturing said transistor cells having varying amount of ballasting resistances further comprising a step of manufacturing the transistor cells to have a source doping profile to produce a gradually increased ballasting resistance from a peripheral area to areas adjacent to source wire locations of said semiconductor power device wherein transistor cells in said peripheral area having no ballasting source doping-reduction.

10. The method of claim 1 wherein:
said step of manufacturing said transistor cells having varying amount of ballasting resistances further comprising a step of manufacturing the transistor cells as metal oxide semiconductor field effect transistor (MOSFET) cells.

11. The method of claim 1 wherein:
said step of manufacturing said transistor cells having varying amount of ballasting resistances further comprising a step of manufacturing the transistor cells as vertical DMOS cells.

12. The method of claim 1 wherein:
said step of manufacturing said transistor cells having varying amount of ballasting resistances further comprising a step of manufacturing the transistor cells as lateral DMOS cells.

13. The method of claim 1 wherein:
said step of manufacturing said transistor cells having varying amount of ballasting resistances further comprising a step of manufacturing the transistor cells as IGBT cells.

14. The method of claim 1 wherein:
said step of manufacturing said transistor cells having varying amount of ballasting resistances further comprising a step of increasing the ballasting resistance in said transistor cells with a reduced source doping concentration.

15. The method of claim 1 wherein:
said step of manufacturing said transistor cells having varying amount of ballasting resistances further comprising a step of varying the ballasting resistance of the transistor cells by reducing a source contact area.

16. The method of claim 1 wherein:
said step of manufacturing said transistor cells having varying amount of ballasting resistances further comprising a step of applying a higher resistance diffusion between a source contact and a source edge of gate regions by with a lightly doped drain (LDD).

17. The method of claim 1 wherein:
said step of manufacturing said transistor cells having varying amount of ballasting resistances further comprising a step of forming a ballasting source area in a source region of each of said transistor cells having a reduced source doping concentration.

18. The method of claim 1 wherein:
said step of manufacturing said transistor cells having varying amount of ballasting resistances further comprising a step of forming a ballasting source area in said transistor cells distributed in said different areas by reducing a source doping concentration and different area specific sized of said ballasting source area in each of said transistor cells.

19. The method of claim 1 wherein:
said step of manufacturing said transistor cells having varying amount of ballasting resistances further comprising a step of forming a resistive layer between source contacts of said transistor cells to source regions of said transistor cells.

* * * * *